(12) United States Patent
Kim (10) Patent No.: US 9,000,732 B2
(45) Date of Patent: Apr. 7, 2015

(54) APPARATUS AND METHOD FOR MANAGING BATTERY PACK BASED ON DEGRADED CELL

(75) Inventor: Cheol-Taek Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 339 days.

(21) Appl. No.: 13/550,193

(22) Filed: Jul. 16, 2012

(65) Prior Publication Data

US 2012/0274281 A1 Nov. 1, 2012

Related U.S. Application Data

(63) Continuation of application No. PCT/KR2011/008715, filed on Nov. 15, 2011.

(30) Foreign Application Priority Data

Dec. 29, 2010 (KR) ........................ 10-2010-0138053

(51) Int. Cl.
*H02J 7/04* (2006.01)
*G01R 31/36* (2006.01)
*H02J 7/00* (2006.01)

(52) U.S. Cl.
CPC ........ *G01R 31/3679* (2013.01); *G01R 31/3658* (2013.01); *G01R 31/362* (2013.01); *H02J 7/0021* (2013.01)

(58) Field of Classification Search
CPC . H02J 7/0021; G01R 31/362; G01R 31/3658; G01R 31/3679

USPC .......... 320/134, 136, 162, 163; 324/433, 434; 702/63
See application file for complete search history.

(56) References Cited

U.S. PATENT DOCUMENTS

| | | | | | |
|---|---|---|---|---|---|
| 5,625,272 | A | * | 4/1997 | Takahashi | 320/116 |
| 5,675,258 | A | * | 10/1997 | Kadouchi et al. | 324/433 |
| 2003/0030442 | A1 | * | 2/2003 | Sugimoto | 324/429 |
| 2006/0284614 | A1 | | 12/2006 | Kim et al. | |
| 2009/0259419 | A1 | * | 10/2009 | Kasai | 702/63 |
| 2010/0019725 | A1 | * | 1/2010 | Nakatsuji | 320/118 |
| 2010/0085009 | A1 | | 4/2010 | Kang et al. | |

FOREIGN PATENT DOCUMENTS

| | | |
|---|---|---|
| KR | 10-1999-0039187 A | 6/1999 |
| KR | 10-2003-0038992 A | 5/2003 |
| KR | 10-2006-0130509 A | 12/2006 |
| KR | 10-2010-0019256 A | 2/2010 |

* cited by examiner

*Primary Examiner* — Yalkew Fantu
*Assistant Examiner* — Manuel Hernandez
(74) *Attorney, Agent, or Firm* — Birch, Stewart, Kolasch & Birch, LLP (57) ABSTRACT

The present invention discloses an apparatus for managing a battery pack by reflecting a degradation degree of secondary cells, selecting the secondary cell having a maximum disparate voltage value among calculated disparate voltage values as a degraded cell in the current charging cycle, and updating the information on the degraded cell.

15 Claims, 4 Drawing Sheets

FIG. 1

Prior Art

| condition | MINIMUM REFERENCE VOLTAGE =1.0V / MAXIMUM REFERENCE VOLTAGE =3.5V REFERENCE DIAGNOSING VALUE=1.0 | | | | |
|---|---|---|---|---|---|
| NO | V1 (VOLTAGE AT $t_1$) | V2 (VOLTAGE AT $t_2$) | △V | STATE | DETERMINATION |
| # 1 CELL | 1.1V | 3.5V | 2.4 | max △V | DEGRADED CELL |
| # 2 CELL | 1.5V | 2.6V | 1.1 | min △V | - |
| # 3 CELL | 1.3V | 2.7V | 1.4 | - | - |
| # 4 CELL | 1.0V | 2.5V | 1.5 | - | - |
| # 5 CELL | 1.4V | 2.7V | 1.3 | - | - |

APPARATUS AND METHOD FOR MANAGING BATTERY PACK BASED ON DEGRADED CELL

CROSS-REFERENCE TO RELATED APPLICATION

This application is a continuation of International Application No. PCT/KR2011/008715 filed on Nov. 15, 2011, which claims priority to Korean Patent Application No. 10-2010-0138053 filed in the Republic of Korea on Dec. 29, 2010, the entire contents described in the specification and drawings of which are incorporated herein by reference.

TECHNICAL FIELD

The present invention relates to an apparatus and method for managing a battery pack consisting of a plurality of secondary cells and a battery pack using the same, and more particularly, to an apparatus and method for managing a battery pack by reflecting a degradation degree of the secondary cells and a battery pack using the same, which can efficiently control various parameters, representing the characteristics of the battery pack, produced by effectively reflecting a degraded state of the secondary cells, thereby minimizing a performance degradation of the battery pack and leading to a stable operation of electric vehicles equipped with the battery pack.

BACKGROUND ART

A secondary battery has high applicability depending on the product group and excellent electrical characteristics such as high energy density, and thus is commonly used as an electric power source of electric vehicles (EV) or hybrid vehicles (HV) as well as mobile devices.

Such a secondary battery significantly reduces the use of fossil fuels and does not generate by-products that come with energy consumption, which can improve environmental friendliness and energy efficiency. For these reasons, a secondary battery is gaining attention as an alternative energy source.

Recently, with the increasing significance of global issues relating to the exhaustion of energy resources such as fossil fuels, environmental pollution, economically efficient energy use, and the like, a smart grid system has been actively studied to effectively overcome the inequality in power consumption and power production and solve the problems caused thereby, such as, for example, the waste of power when power is oversupplied and power overload when power supply is in shortage. The smart grid system flexibly controls the power supply using a variety of information and communication infrastructures. These smart grid systems are being vigorously studied and such a secondary battery is gaining attention as a source for an efficient energy storage and application in the smart grid system.

When a secondary battery is used as a battery for instruments such as a mobile terminal, although not necessarily so, it is conventionally used in the form of an assembly of a plurality of secondary unit cells to satisfy a high capacity need.

Figure 1:
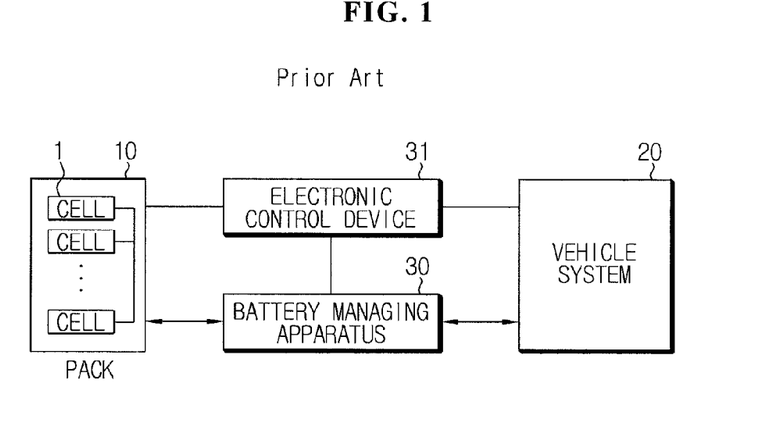
FIG. 1 schematically shows a configuration of a general apparatus for managing a battery pack.

As schematically shown in FIG. 1, in the case that a battery pack 10 consisting of an assembly of a plurality of secondary cells 1 is used in electric vehicles, a battery managing apparatus 30 such as a BMS (battery management system), which monitors and controls the status of the secondary cells by means of a power supply control for driving loads such as a motor, the measurement of electrical characteristics such as current, voltage and the like, the control of charging and discharging, the control of voltage equalization, the application of an algorithm for estimating a SOC (state of charge) may further be included.

The battery managing apparatus 30 controls an electronic control device 31 and a power system provided in a vehicle system 20 consisting of driving loads such as a motor, as mentioned above, and also transmits information on the present SOC or SOH (state of health) of the battery pack 10 into the vehicle system 20, to interface the information on the present status of the battery to a user or a driver.

As mentioned above, the battery pack 10 used in vehicles consists of a plurality of secondary cells connected in series and/or parallel, and the battery pack supplies power in loads such as a motor, a generator, an electric installation through a system prepared by the electric connection of the plurality of secondary cells.

In this regard, a power system having secondary cells may not provide state information on a presently usable power in a physical and absolute criterion, unlike a gasoline engine system, and so various methods estimating or predicting SOC by using various electrical characteristics or parameter information are known in the art.

Meanwhile, a plurality of secondary cells constituting the battery pack generates a capacity difference between the cells, which results from the intrinsic characteristics, differences in manufacturing environment, diversity of system application as use time passes, and further leads to the terminal voltage difference or SOC difference of a relevant secondary cell due to charging and discharging.

Such a difference can result from coulomb efficiency, which is generated as each cell has a different dynamic state separate from each other, or by a differential variation of an internal resistance according to a physical configuration. Thus, in the case that the plurality of secondary cells having relatively different electrical characteristics operates in a single battery pack, there is a problem that the charging or discharging capacity of the whole battery pack is restricted by a certain secondary cell having a degraded performance.

According to the fundamental characteristics, a plurality of secondary cells constitutes a battery pack having different profiles for each cell, and thus whether a secondary cell is degraded or not and the degree of degradation for each cell are individually different. Nevertheless, the conventional SOC estimating methods have been made simply by only using statistical values such as an average voltage value of the secondary cells, regardless of the fundamental characteristics and statuses of the secondary cells, so the conventional methods do not provide the present performance of the battery pack or substantial and efficient information on the SOC thereof. Particularly, secondary cells used for a long period of time have even greater electric characteristic differences.

The stability and safety of electric vehicles for which the secondary cells are used is a significantly important issue, and a problem regarding thereto may cause unpredicted errors during the operation or application of the vehicles and, in a severe case, stop the operation of the vehicles. This is an important problem which may not be solved by simply applying numerical values obtained from the calculation of the SOC.

Also, the conventional methods for balancing or equalizing a performance difference for each secondary cell include a bucking method of consuming the voltage and charged energy of the secondary cells having electrical characteristic values (SOC, voltage or the like) not lower than a certain reference value, to equalize the electrical characteristic values of the secondary cells, or shuffling methods including a boosting method of maintaining a selective interruption to the outside and further conducting a separate charging for only secondary cell having a lower electrical characteristic value.

However, such equalization methods are conducted in the form of integrated processing for all secondary cells included in a battery pack without taking into consideration the selection of a certain cell by considering respectively a degradation state of each secondary cell, and thus the methods are unfavorable in terms of effectiveness.

DISCLOSURE

Technical Problem

The present invention is designed to solve the problems of the prior art, and therefore, it is an aspect of the present invention to provide an apparatus and method for managing a battery pack, which can improve its effectiveness by accurately determining a degradation degree of a plurality of secondary cells constituting the battery pack, and then reflecting the degradation degree to estimate selectively or differentially a SOC of the battery pack and conduct a subsequent process such as the balancing of the secondary cells.

Additional aspects and advantages will be apparent from the embodiments of the present invention. The aspects and advantages of the invention may be realized by means of instrumentalities and combinations particularly pointed out in the appended claims.

Technical Solution

In order to accomplish the above object, the present invention provides an apparatus for managing a battery pack by reflecting a degradation degree of secondary cells, the apparatus comprising: a voltage sensing unit for measuring the voltages of a plurality of secondary cells constituting the battery pack; a first monitoring unit for storing a first voltage value being the voltage value that each of the plurality of secondary cells individually represents at the time when all voltage values of the plurality of secondary cells are not lower than a minimum reference voltage value in a charging cycle; a second monitoring unit for storing a second voltage value being the voltage value that each of the plurality of secondary cells individually represents at the time when the voltage of one cell among the plurality of secondary cells is not lower than a maximum reference voltage value in the charging cycle; and a controlling unit for calculating a disparate voltage value being the difference between the first voltage value and the second voltage value, selecting the secondary cell having a maximum disparate voltage value among the calculated disparate voltage values as a degraded cell in the current charging cycle, and updating the information on the degraded cell.

Herein, in the case that the difference between a minimum disparate voltage value and the maximum disparate voltage value among the calculated disparate voltage values is not lower than a reference diagnosing value, the controlling unit of the present invention selects the secondary cell having the maximum disparate voltage value as a degraded cell in the current charging cycle, and updates information on the degraded cell.

In order to accomplish a more preferred embodiment, in the case that the difference between the minimum disparate voltage value and the maximum disparate voltage value among the calculated disparate voltage values is not lower than a reference diagnosing value, the controlling unit outputs an alarm signal, and in the case that the alarm signal is input from the controlling unit, the apparatus of the present invention may further comprise a SOC (state of charge) determining unit for determining the SOC of the battery pack based on the voltage value of the degraded cell.

Herein, in the case that the alarm signal is input and then the present state of the battery pack is in a discharging mode, the SOC determining unit determines the lower value between the SOC based on an average voltage value of the plurality of secondary cells and the SOC based on the voltage value of the degraded cell, as a present SOC of the battery pack.

Also, in the case that the alarm signal is input and then the present state of the battery pack is in a charging mode, the SOC determining unit determines the higher value between the SOC based on an average voltage value of the plurality of secondary cells and the SOC based on the voltage value of the degraded cell as the present SOC of the battery pack.

Furthermore, it is preferred that the present invention further comprises a balancing unit for conducting equalization on the remaining secondary cells excluding the degraded cells in the case that the alarm signal is input.

In addition, in the case that the charging cycle progresses in the state that the voltage values of the plurality of secondary cells exceed the minimum reference voltage or the charging cycle ends in the state that none of the plurality of secondary cells reaches the maximum reference voltage, the controlling unit maintains the degraded cell selected in the previous charging cycle as a degraded cell in the current charging cycle.

Meanwhile, in order to accomplish the object according to the other aspect of the present invention, the present invention provides a method for managing a battery pack by reflecting a degradation degree of secondary cells, the method comprising: a voltage sensing step of measuring the voltages of a plurality of secondary cells constituting the battery pack; a first storing step of storing a first voltage value being the voltage value that each of the plurality of secondary cells individually represents at the time when all voltage values of the plurality of secondary cells are not lower than a minimum reference voltage value in a charging cycle; a second storing step of storing a second voltage value being the voltage value that each of the plurality of secondary cells individually represents at the time when the voltage of one cell among the plurality of secondary cells is not lower than a maximum reference voltage value in the charging cycle; and a controlling step of calculating a disparate voltage value being the difference between the first voltage value and the second voltage value, selecting the secondary cell having a maximum disparate voltage value among the calculated disparate voltage values as a degraded cell in the current charging cycle, and updating the information on the degraded cell.

Meanwhile, in order to accomplish the object according to another aspect of the present invention, the present invention provides a battery pack comprising a managing module reflecting a degradation degree of secondary cells, the managing module comprising: a plurality of secondary cells for supplying power by a charging and discharging process; a voltage sensing unit for measuring the voltages of a plurality of secondary cells constituting the battery pack; a first monitoring unit for storing a first voltage value being the voltage value that each of the plurality of secondary cells individually represents at the time when all voltage values of the plurality of secondary cells are not lower than a minimum reference voltage value in a charging cycle; a second monitoring unit for storing a second voltage value being the voltage value that each of the plurality of secondary cells individually represents at the time when the voltage of one cell among the plurality of secondary cells is not lower than a maximum reference voltage value in the charging cycle; and a controlling unit for calculating a disparate voltage value being the difference between the first voltage value and the second voltage value, selecting the secondary cell having a maximum disparate voltage value among the calculated disparate voltage values as a degraded cell in the current charging cycle, and updating the information on the degraded cell.

Advantageous Effects

In accordance with the battery managing apparatus and method of the present invention and the battery pack using the same, it is possible to determine relatively and accurately a degradation degree of a plurality of secondary cells constituting the battery pack and, based on this, to estimate a SOC of one of the electrical characteristics of the battery pack, thereby providing a SOC that more substantially reflects the present status of the battery pack and interfacing the results to a user such as a driver for more stable vehicle driving.

Also, the relative degradation degree between the secondary cells can be reflected in balancing (equalizing) which is conducted to improve a performance of the battery pack and thus selectively applied to the cell requiring balancing among the plurality of secondary cells, thereby conducting a more improved processing.

Furthermore, in accordance with the configuration of the present invention, more accurate and substantial information on the present status of the battery pack can be provided to a user such as a driver, thereby promoting a more stable and safe operation of electric vehicles.

DESCRIPTION OF THE DRAWINGS

The accompanying drawings illustrate preferred embodiments of the present disclosure and, together with the foregoing disclosure, serve to provide further understanding of the technical spirit of the present disclosure. However, the present disclosure is not to be construed as being limited to the drawings.

BEST MODE

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

Therefore, the description proposed herein is just a preferable example for the purpose of illustrations only, not intended to limit the scope of the invention, so it should be understood that other equivalents and modifications could be made thereto without departing from the spirit and scope of the invention.

Figure 2:
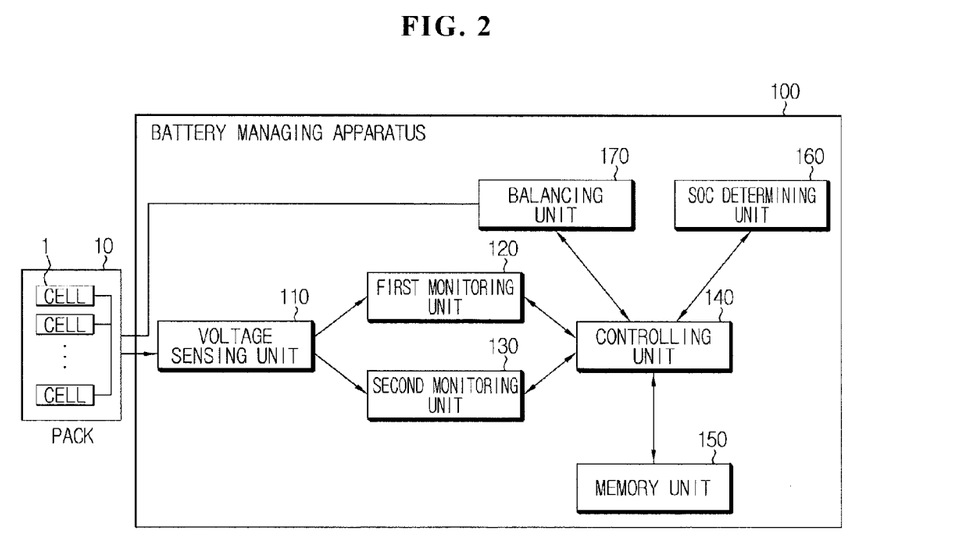
FIG. 2 is a block diagram showing a configuration of an apparatus for managing a battery pack according to a preferred embodiment of the present invention.
Figure 5:
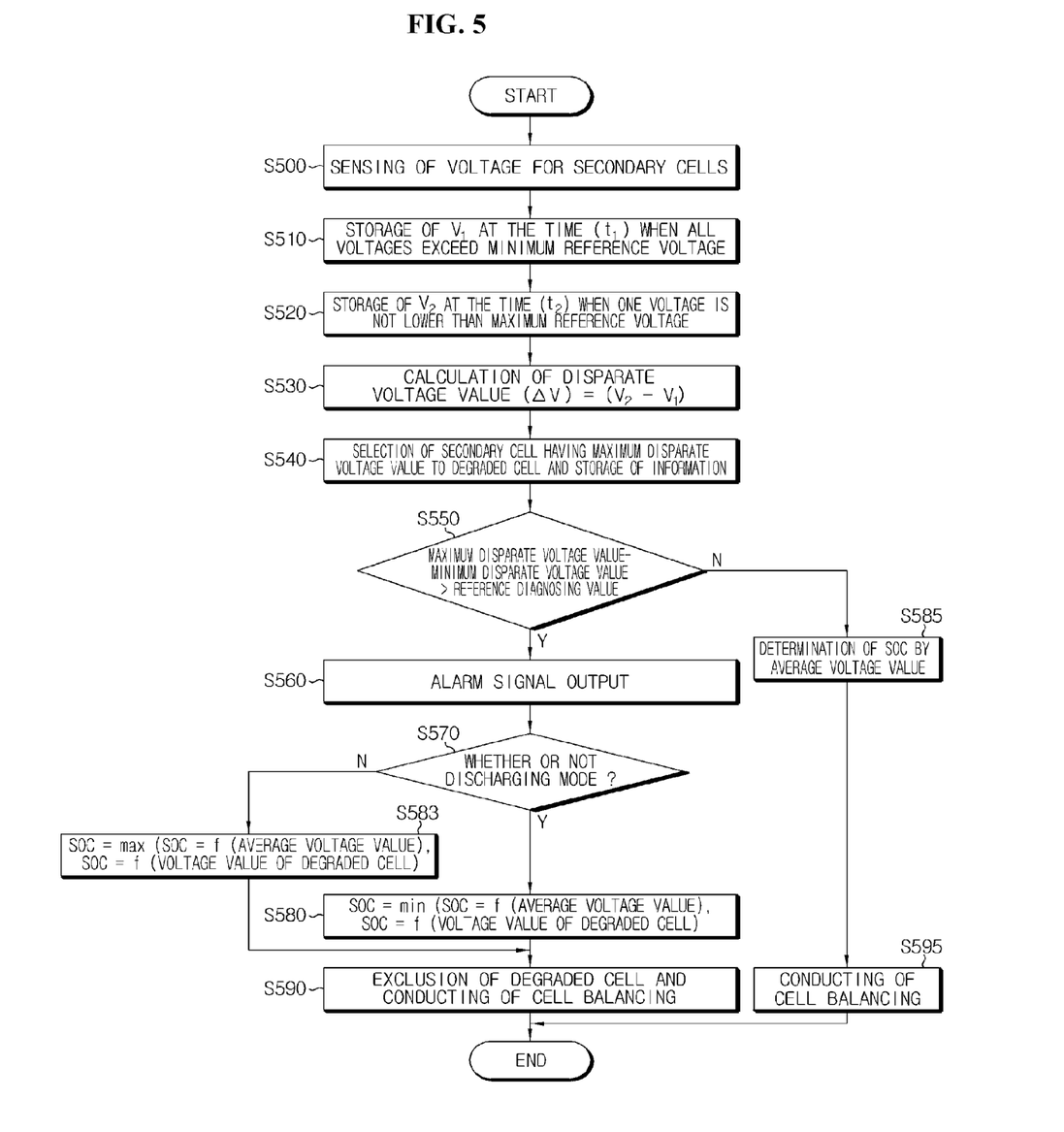
FIG. 5 is a flow chart illustrating the procedure of a method for managing a battery pack according to a preferred embodiment of the present invention.

FIG. 2 is a block diagram showing a configuration of an apparatus for managing a battery pack (hereinafter, refers as 'managing apparatus') 100 by reflecting a degradation degree of secondary cells according to a preferred embodiment of the present invention, and FIG. 5 is a flow chart illustrating the procedure of a method for managing a battery pack according to a preferred embodiment of the present invention.

As shown in FIG. 2, the managing apparatus 100 of the present invention comprises a voltage sensing unit 110, a first monitoring unit 120, a second monitoring unit 130; a controlling unit 140, a memory unit 150, a SOC determining unit 160 and a balancing unit 170.

Meanwhile, each component for the managing apparatus 100 of the present invention shown in FIG. 2 should be understood as a logically distinguished component, rather than a physically distinguished component.

In other words, each component corresponds to an element logically distinguished for realizing the spirit of the present invention, and should be understood as being included in the scope of the present invention if it may realize its logic function though it is separately implemented or integrated with another component, and components realizing their same or similar function should be understood as being included in the scope of the present invention even though their designations are different.

The present invention is constructed to provide more substantiality or effectiveness on electrical characteristic values such as a SOC in a battery pack 10 by checking a voltage behavior or profile information for each of a plurality of secondary cells 1 constituting the battery pack 10 and, based on this, introducing a degradation degree or a relative degradation degree concept for the plurality of secondary cells 1.

For this, the voltage sensing unit 110 of the present invention senses a voltage for each of the plurality of secondary cells 1 constituting the battery pack 10 when a real-time or periodic order signal is input (S500).

The sensed voltage value of each secondary cell 1 is input into the first monitoring unit 120 and the second monitoring unit 130 of the present invention. In the case that a charging cycle is driven for the secondary cells 1 constituting the battery pack 10, the first monitoring unit 120 monitors the time ($t_1$) when all voltage values of the plurality of secondary cells 1 exceed a minimum reference voltage and stores the voltage value of each secondary cell 1 at said $t_1$.

Figure 3:
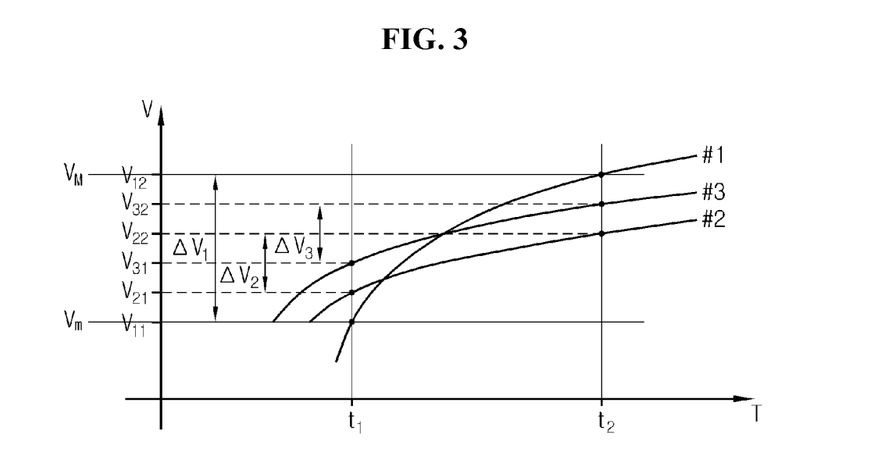
FIG. 3 represents a profile on the voltage behavior of secondary cells according to a preferred embodiment of the present invention.

The secondary cells 1 may be charged by power supplied from outside according to their electrochemical characteristics, and their voltages and SOC after charging are higher than those before charging, so the secondary cells 1 have a function relation in which their status values (e.g., voltage) increase over time, as shown in FIG. 3.

As mentioned above, the secondary cells 1 are assembled in plurality to constitute one battery pack 10 which functions as a single object in a power system. Accordingly, it is more effective that the plurality of secondary cell 1 constituting one battery pack would rather be relatively determined for their mutual characteristic values than that an individual cell is determined than for its performance or characteristic in an absolute criterion.

In general, the more the plurality of secondary cells 1 is used for a long period of time, the more the voltage difference between the cells increases. This occurs from various causes including the intrinsic resistance variation of the secondary cells 1, a coulomb efficiency, a charging/discharging efficiency in the secondary cells and a structural problem of an electric connection terminal. Even though all of the secondary cells are produced under the same procedure (but they may substantially be produced in a different procedure, a different manufacturer or a different manufacture time), their electrical characteristic values including voltages observed externally may have different states depending on applied electrical equipment conditions, a liquid electrolyte, the change of an active material or the like.

The present invention effectively reflects such a phenomenon to determine the secondary cells 1 having a relatively high degradation degree among the plurality of secondary cells 1 by a profile characteristic of a voltage behavior exhibited in a charging cycle. For this, as a reference for determining the profile characteristic of the voltage behavior, a minimum reference voltage (Vm) reached during charging is used.

The minimum reference voltage and a maximum reference voltage which will be described hereinafter may have various values depending on specifications of a battery or secondary cells, a size of a battery applied, specifications of a system, hardware resources, characteristics of vehicles mounted, a use time or the like.

The first monitoring unit 120 of the present invention monitors the voltage values input from the voltage sensing unit 110 and, in the case that a charging cycle is driven for the battery pack, determines the time when all voltages of the plurality of secondary cells exceed a minimum reference voltage value, and stores first voltage values being the voltage values of the plurality of secondary cells at said time (S510). Accordingly, the first voltage value for each of the plurality of secondary cells 1 is measured based on the same time.

As shown in FIG. 3, secondary cell #1 is the last to exceed the minimum reference voltage value. This point is designated as $t_1$. Then, the first monitoring unit 120 stores the voltage value of each secondary cell at said $t_1$.

Accordingly, the voltage value of secondary cell #2 at said $t_1$ is $V_{21}$, and the voltage value of secondary cell #3 at said $t_1$ is $V_{31}$, secondary cell #1 at said $t_1$, is $V_{11}$, and said $V_{11}$ corresponds to $V_m$.

Then, as the charging cycle is continuously progressed, the voltage of each secondary cell increases. When the voltage of one cell among the plurality of secondary cells is not lower than a maximum reference voltage value in the charging cycle during driving such a charging cycle, the second monitoring unit 130 of the present invention stores a second voltage value being the voltage value that each of the plurality of secondary cells individually represents at that time (S520). Accordingly, the second voltage value for each of the plurality of secondary cells 1 is also measured based on the same time.

Accordingly, $t_2$ is designated as the time when the first one among the plurality of secondary cells reaches a maximum reference voltage value and the second monitoring unit 130 stores a second voltage value being the voltage value that each of the plurality of secondary cells individually represents at said $t_2$. As shown in FIG. 3, the voltage value of secondary cell #1 at said $t_2$ is $V_{12}$, secondary cell #2, $V_{22}$, and secondary cell #3, $V_{32}$.

Thus, the reason for estimating conditions for the maximum reference voltage is to reflect variations in the electrochemical characteristics of the secondary cells if possible and minimize a characteristic change thereof due to noise or a temporary phenomenon.

The embodiment of FIG. 3 shows only three secondary cells 1 constituting a battery pack, for the convenience of explanation, but it is apparent that even more secondary cells 1 may be used in the present invention.

The controlling unit 140 of the present invention receives the first voltage value and the second voltage value for each secondary cell input in the first monitoring unit 120 and the second monitoring unit 130, respectively, and calculates a disparate voltage value as the difference between the first voltage value and the second voltage value for each individual secondary cell (S530).

Thus, if the disparate voltage value is calculated for each individual secondary cell, among these, the secondary cell having the maximum disparate voltage value is selected to a degraded cell in the current charging cycle and information on the secondary cell selected as the degraded cell is updated in a certain memory unit 150 (S540).

As mentioned above, if the secondary cells are degraded, they are subject to performance deterioration such as an intrinsic resistance increase and a capacity decrease. As a result, the voltages of the cells easily increase at low states of charging, and such a physical characteristic is intensified as the charging is progressed.

Therefore, by effectively reflecting this phenomenon, as mentioned above, the secondary cell having the maximum disparate voltage value may be determined as being a relatively more degraded cell as compared to other cells.

Thus, if a secondary cell having the most deteriorated performance is selected among the plurality of secondary cells, such a selection, as will be explained below, can be useful in a differential charging/discharging control including a SOC estimation and a cell balancing process, or various subsequent process or control including a process of selecting a target cell and then applying a different voltage monitoring period thereto or storing as historical data to use in the exchange or repair of the secondary cells.

Also, when the secondary cell having the maximum disparate voltage value among the plurality of secondary cells is designated as a degraded cell, in order to effectively reflect a relative difference between the relevant cell and other secondary cells for a voltage behavior to a degradation degree, in the case that the difference between a minimum disparate voltage value and the maximum disparate voltage value among the individual disparate voltage value of each of the plurality of secondary cells is not lower than a reference diagnosing value, the controlling unit may select the secondary cell having the maximum disparate voltage value as a degraded cell.

That is, since the electrical characteristics between the plurality of secondary cells cannot physically be the same, and even if regarded as the most relatively degraded cell, its degradation degree may not be so significant as compared to other secondary cells. Accordingly, only in the case that the electrical characteristics between the secondary cells exceed a pre-determined reference diagnosing value, the relevant certain cell may be selected as a degraded cell.

Figure 4:
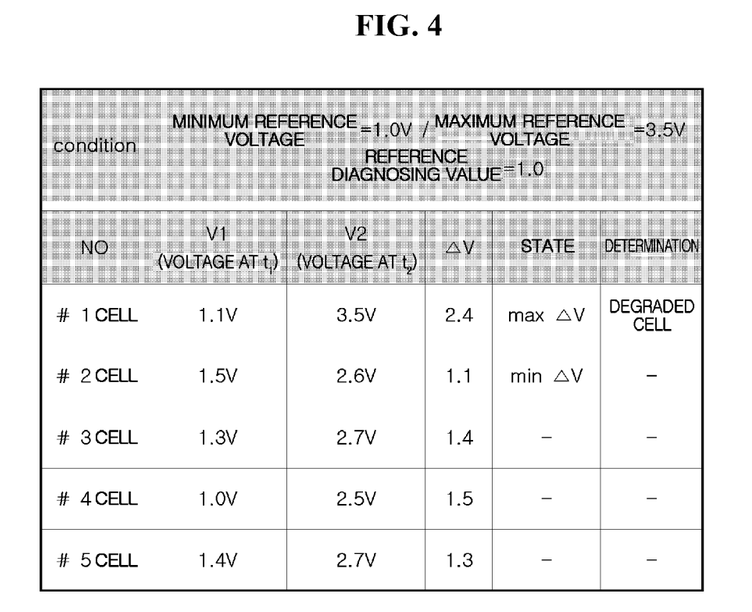
FIG. 4 illustrates the determination of a degraded cell according to a preferred embodiment of the present invention.

The technical spirit of the present invention which is described above will be further explained with reference to FIG. 4 below. The numerical values and the number of the secondary cells shown in FIG. 4 are just for illustrations only, not intended to limit the embodiment of the present invention.

First, the battery pack 10 consists of five secondary cells, and a minimum reference voltage is established to 1.0V, a maximum reference voltage, 3.5V and a reference diagnosing value 1.0. Also, it is premised that all of the secondary cells are charged in the state that a minimum reference voltage is 1.0V or less.

The voltages of all the secondary cells increase during a charging process, and the voltages of the other secondary cells exceed the minimum reference voltage before secondary cell #4 reaches the minimum reference voltage of 1.0V. Accordingly, at the time ($t_1$) when the minimum reference voltage of secondary cell #4 is 1.0V, the voltage of each of the secondary cells is, in number order, 1.1V, 1.5V, 1.3V 1.0V and 1.4V, respectively, which are first voltage values of each secondary cell.

The charging process is continuously progressed and the voltages of all of the secondary cells continuously increase. Since the voltages of secondary cell #1 among the plurality of secondary cells first exceeds the maximum reference voltage, at the time ($t_2$) when the voltage of the secondary cell #1 first reaches the maximum reference voltage, the voltage value of each of secondary cells is a second voltage value of each secondary cell.

That is, the second voltage value of each of secondary cells is, in number order, 3.5V, 2.6V, 2.7V, 2.5V and 2.7V, respectively. Then, the difference value between the first voltage value and the second voltage value, i.e., a disparate voltage value ($\Box V$) for each of secondary cells is, in number order, 2.4, 1.1, 1.4, 1.5 and 1.3, respectively.

If the reference diagnosing value is not established, secondary cell #1 having the highest disparate voltage value ($\Box V$) will be selected as a degraded cell, in the embodiment of FIG. 4 in which the reference diagnosing value is established, since the maximum disparate voltage value of 2.4 is greater than the reference diagnosing value of 1.0, although the reference diagnosing value is established, secondary cell #1 is selected as a degraded cell.

Meanwhile, as mentioned above, if the difference between the minimum disparate voltage value and the maximum disparate voltage value among the calculated disparate voltage value is not lower than the reference diagnosing value, this means that the plurality of secondary cells exhibit a great deviation between their degradation degrees (performance) and thus it is more preferred to operate a different algorithm for estimating a SOC.

The SOC of a battery pack, which is a parameter for exhibiting the charging state of the battery pack, is varied in a numerical range of 0 to 100% and corresponds to the magnitude of a voltage according to electrophysical characteristics, so it is generally represented by using an average voltage value of the secondary cells constituting the battery pack.

If the secondary cells do not have a great deviation between their performance, in the case that as a statistical numerical value, an average is used for estimating or predicting the SOC as in the conventional method, a slight error may be generated. However, if the performance deviation exceeds a significant range, the use of an average to estimate the SOC may not provide substantial information and may inhibit the safety of vehicle operation.

As mentioned above, among the plurality of secondary cells, the secondary cell which is severely degraded, may affect the performance of the whole battery pack due to electrophysical characteristics and battery structure. Nevertheless, if an average voltage value is, as it is, used to estimate the SOC, a numerical value distinct from a substantial performance of the battery may be calculated.

Generally, the present SOC of the battery pack equipped in vehicles represents a possible running distance of vehicles. For example, if an average voltage value is used as in the conventional method, the SOC is 40%, based on a relevant function relation, and 80 km of possible running distance is calculated and interfaced to a driver through a display device of vehicles. However, if the substantial SOC is limited by 20% due to the influence of the secondary cell being severely degraded, the vehicles may stop after running about 40 km, which is a severe problem in terms of safety.

Therefore, in order to fundamentally prevent such a problem, it is preferred to select a degraded cell and calculate a SOC based on a voltage profile of the selected cell to use in a subsequent control process such as interfacing.

For this, in the case that the difference between a minimum disparate voltage value and the maximum disparate voltage value among the calculated disparate voltage values is not lower than a reference diagnosing value (S550), the controlling unit 140 of the present invention outputs an alarm signal for informing the fact into a SOC determining unit 160 (S560).

The SOC determining unit 160 of the present invention determines the SOC of the battery pack based on the voltage value of the degraded cell in the case that the alarm signal is input from the controlling unit 140. The SOC information of a battery pack thus determined may be transmitted through the controlling unit 140 of the present invention into a system of vehicles (e.g., the display device of driver's seat).

The battery pack is in a discharging mode when vehicles are driven, while a charging mode when an external power is applied or a power source is supplied from an operating module such as a motor of vehicle.

It is preferred that the SOC is differentially determined depending on a mode of the battery pack. For example, in a discharging mode at which the power source of the battery pack is used to operate vehicles by power supply to the electric motor of vehicles to be used as an operating source of the vehicles, in order to overcome a problem arisen by providing to a user with a SOC information exceeding the substantial SOC of the battery pack, it is preferred to determine the lower value between the SOC based on an average voltage value of the plurality of secondary cells and the SOC based on the voltage value of the degraded cell as the last SOC of the battery pack.

For this, in the case that the alarm signal is input from the controlling unit 140, the SOC determining unit 160 checks whether the present state of the battery pack is a discharging mode (S570) and, in the case of the discharging mode, determines the lower value between the SOC based on an average voltage value of the plurality of secondary cells and the SOC based on the voltage value of the degraded cell, as a present SOC of the battery pack (S580).

If the state of the battery pack is in a charging mode, not a discharging mode, it is preferred to enable stable operation of the battery pack to prevent overcharging. For this, in the case that the alarm signal is input from the controlling unit 140 and then the present state of the battery pack is in a charged mode, the SOC determining unit 160 of the present invention determines the higher value between the SOC based on an average voltage value of the plurality of secondary cells and the SOC based on the voltage value of the degraded cell as the present SOC of the battery pack (S583).

Meanwhile, in the step of S550 described above, i.e., in the case that the difference between a minimum disparate voltage value and the maximum disparate voltage value among the calculated disparate voltage values is not lower than a reference diagnosing value, since performance difference between individual secondary cells does not significantly affect the performance of the whole battery pack, in this case, the SOC may be generally calculated based on an average voltage value of the plurality of secondary cells (S585).

Also, the present invention may further include a balancing unit 170 for equalizing the voltage or SOC of the plurality of secondary cells. In accordance with such a technical spirit, it is preferred that the equalization is conducted on the remaining secondary cells excluding the degraded cell in the case that the alarm signal is input from the controlling unit 140 of the present invention (S590).

The minimum reference voltage and maximum reference voltage which are described above correspond to objective data for checking a deviation between the performance or degradation degree of the secondary cells. Accordingly, in the state that such objective data are established, it is preferred to not select the degraded cell described above.

That is, in the case that the charging cycle progresses in the state that the voltage values of the plurality of secondary cells exceed the minimum reference voltage or the charging cycle ends in the state that none of the plurality of secondary cells reaches the maximum reference voltage, the controlling unit 140 of the present invention controls the degraded cell selected in the previous charging cycle and is maintained as a degraded cell in the current charging cycle.

As is well known, since the charging cycle may be alternated with a discharging or periodically progress, the controlling unit 140 of the present invention applies such an algorithm for each charging cycle to maintain or update the information of the degraded cell which is previously selected with a degraded cell selected in the current charging cycle.

Figure 6:
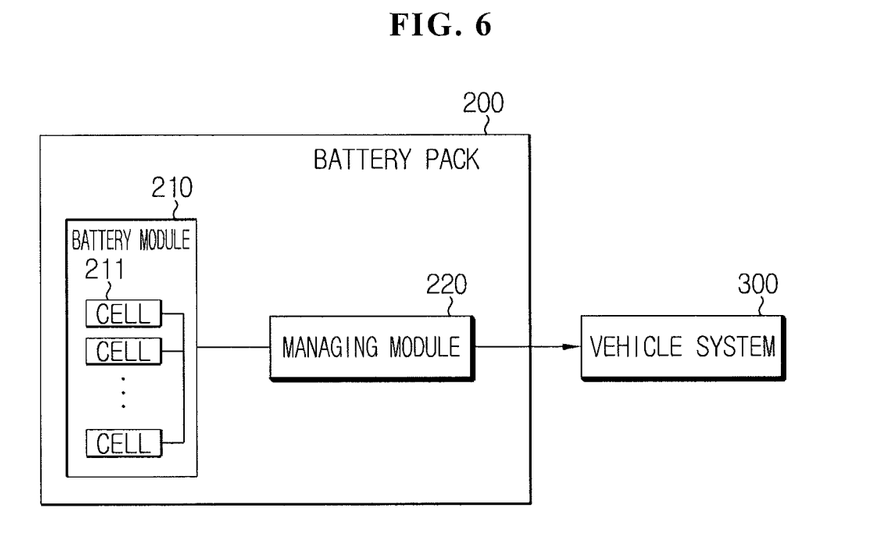
FIG. 6 is a block diagram showing a configuration of a battery pack according to a preferred embodiment of the present invention.

The battery managing apparatus 100 of the present invention which is described above may include a system of the battery pack 200 as shown in FIGS. 1 and 6, the battery pack 200 of the present invention as shown in FIG. 6 may be charged and discharged, and include a battery module 210 for supplying power in vehicles and include a managing module 220 which may be included in the managing apparatus described above. The battery module 210 may consist of a plurality of secondary cells 211, and the battery pack 200 of the present invention, particularly the managing module 220 transmits information required for vehicle operation into a vehicle system 300 and inputs user need information as described above.

The explanation of the specific configuration including the managing module 220 of the battery pack 200 corresponds to the disclosure of the battery managing apparatus which is described above, which is replaced with the foregoing disclosure.

INDUSTRIAL APPLICABILITY

The present disclosure has been described in detail. However, it should be understood that the detailed description, specific examples and drawings, while indicating preferred embodiments of the disclosure, are given by way of illustration only, since various changes and modifications within the spirit and scope of the disclosure will become apparent to those skilled in the art from this detailed description.

Meanwhile, the terms 'a first' and 'a second' used herein just represent a logic unit for relatively dividing each configuration with each other, which may not be a component for objectively and physically separating a certain order, priority or importance and separating the configuration in an absolute or physical criterion, which is apparent to those of ordinary skill in the art.

What is claimed is:

1. An apparatus for managing a battery pack having secondary cells, the apparatus comprising:
    a voltage sensing unit configured to measure voltage values of the secondary cells;
    a first monitoring unit configured to store a plurality of first voltage values each corresponding to one of the secondary cells measured when all the voltage values of the secondary cells are greater than or equal to a minimum reference voltage value in a charging cycle;
    a second monitoring unit configured to store a plurality of second voltage values each corresponding to one of the secondary cells when the voltage value of one cell among the secondary cells is greater than or equal to a maximum reference voltage value in the charging cycle; and
    a controlling unit configured to calculate a plurality of voltage disparate values, each value being a difference between the first voltage value and the second voltage value for each cell, determine a secondary cell having a maximum voltage disparate value among the plurality of voltage disparate values as a degraded cell in the charging cycle and manage the battery pack based on the degraded cell.

2. The apparatus for managing a battery pack having secondary cells according to claim 1, wherein, if a difference between a minimum voltage disparate value and the maximum voltage disparate value among the plurality of voltage disparate values greater than or equal to a reference diagnosing value, the controlling unit is configured to determine the secondary cell having the maximum voltage disparate value as the degraded cell in the current charging cycle.

3. The apparatus for managing a battery pack having secondary cells according to claim 1, the apparatus further comprising:
    an SOC determining unit configured to determine an SOC of the battery pack based on a voltage value of the degraded cell.

4. The apparatus for managing a battery pack having secondary cells according to claim 3, wherein, in a discharging mode, the SOC determining unit is configured to determine a lower value between a first SOC based on an average voltage value of the plurality of secondary cells and a second SOC based on the voltage value of the degraded cell, as a present SOC of the battery pack.

5. The apparatus for managing a battery pack having secondary cells according to claim 3, wherein, in a charging mode, the SOC determining unit is configured to determine a higher value between a first SOC based on an average voltage value of the plurality of secondary cells and a second SOC based on a voltage value of the degraded cell, as a present SOC of the battery pack.

6. The apparatus for managing a battery pack having secondary cells according to claim 3, the apparatus further comprising:
    a balancing unit configured to conduct equalization on remaining secondary cells except the degraded cell.

7. The apparatus for managing a battery pack having secondary cells according to claim 1, wherein, if the charging cycle progresses in a state that the voltage values of the plurality of secondary cells exceed the minimum reference voltage and the charging cycle ends in a state that none of the plurality of secondary cells reaches the maximum reference voltage, the controlling unit is configured to maintain a degraded cell determined in a previous charging cycle as the degraded cell in the current charging cycle.

8. A method for managing a battery pack having secondary cells, the method comprising the steps of:
    (a) measuring voltage values of the secondary cells;
    (b) storing a plurality of first voltage values each corresponding to one of the secondary cells measured when all the voltage values of the plurality of secondary cells are greater than or equal to a minimum reference voltage in a charging cycle;

(c) storing a plurality of second voltage values each corresponding to one of the secondary cells measured when the voltage value of one cell among the secondary cells is greater than or equal to a maximum reference voltage value in the charging cycle;

(d) calculating a plurality of voltage disparate values, each value being a difference between the first voltage value and the second voltage value for each cell; and (e) determining a secondary cell having a maximum voltage disparate value among the plurality of voltage disparate values as a degraded cell in the charging cycle and managing the battery pack based on the degraded cell.

9. The method for managing a battery pack having secondary cells according to claim 8, wherein, in the step (d), if a difference between a minimum voltage disparate value and the maximum voltage disparate value among the plurality of voltage disparate values is greater than or equal to a reference diagnosing value, the secondary cell having the maximum voltage disparate value is determined as the degraded cell in the current charging cycle.

10. The method for managing a battery pack having secondary cells according to claim 8, the method further comprising:

(f) determining an SOC of the battery pack based on a voltage value of the degraded cell.

11. The method for managing a battery pack having secondary cells according to claim 10, the step (f) comprising:

(f1) determining a present state of the battery pack as a discharging mode; and (f2) determining a lower value between a first SOC based on an average voltage value of secondary cells and a second SOC based on the voltage value of the degraded cell as a present SOC of the battery pack.

12. The method for managing a battery pack having secondary cells according to claim 10, the step of (f) comprising:

(f1) determining a present state of the battery pack as a charging mode; and (f2) determining a higher value between a first SOC based on an average voltage value of the secondary cells and a second SOC based on the voltage value of the degraded cell as a present SOC of the battery pack.

13. The method for managing a battery pack having secondary cells according to claim 10, the method further comprising:

(g) conducting equalization on remaining secondary cells other than the degraded cell.

14. The method for managing a battery pack having secondary cells according to claim 8, wherein, if the charging cycle progresses in a state that all the voltage values of the secondary cells exceed the minimum reference voltage or the charging cycle ends in a state that none of the secondary cells reaches the maximum reference voltage, in the step of (e), a degraded cell determined in a previous charging cycle is maintained as the degraded cell in the current charging cycle.

15. A battery pack comprising:

a plurality of secondary cells;

a voltage sensing unit configured to measure voltage values of the secondary cells;

a first monitoring unit configured to store a plurality of first voltage values each corresponding to one of the secondary cells measured when all the voltage values of the secondary cells are greater than or equal to a minimum reference voltage value in a charging cycle;

a second monitoring unit configured to store a plurality of second voltage values each corresponding to one of the secondary cells measured when the voltage value of one cell among the secondary cells is greater than or equal to a maximum reference voltage value in the charging cycle; and a controlling unit configured to calculate a plurality of voltage disparate values, each value a difference between the first voltage value and the second voltage value for each cell, determine a secondary cell having a maximum voltage disparate value among the plurality of voltage disparate values as a degraded cell in the charging cycle, and manage the battery pack based on the degraded cell.

* * * * *